(12) United States Patent
Otabe et al.

(10) Patent No.: US 6,631,280 B1
(45) Date of Patent: Oct. 7, 2003

(54) OXIDE SUPERCONDUCTING WIRE WITH REDUCED AC LOSS

(75) Inventors: Soji Otabe, Iizuka (JP); Teruo Matsushita, Iizuka (JP); Jun Fujikami, Osaka (JP); Kazuya Ohmatsu, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/380,272

(22) PCT Filed: Feb. 25, 1998

(86) PCT No.: PCT/JP98/00754

§ 371 (c)(1),
(2), (4) Date: Aug. 27, 1999

(87) PCT Pub. No.: WO98/38650

PCT Pub. Date: Sep. 3, 1998

(30) Foreign Application Priority Data

Feb. 27, 1997 (JP) .............................................. 9-043879

(51) Int. Cl.$^7$ .............................................. H01B 12/00
(52) U.S. Cl. .................................... 505/230; 174/125.1
(58) Field of Search ....................... 174/125.1; 565/230, 565/231, 234, 236, 704, 887, 884

(56) References Cited

U.S. PATENT DOCUMENTS 5,430,008 A * 7/1995 Morris .................... 174/125.1

FOREIGN PATENT DOCUMENTS

| EP | 0 736 914 | 10/1996 |
|----|-----------|---------|
| JP | 08-335414 | 12/1996 |

* cited by examiner

*Primary Examiner*—Kamand Cuneo
(74) *Attorney, Agent, or Firm*—Foley & Lardner

(57) ABSTRACT

A low-loss oxide superconducting wire using a reversible phenomenon is disclosed. The oxide superconducting wire is formed with a metal-coated multi-filamentary superconductor having a plurality of superconducting filaments in a matrix, in which $$d \leq 2 \, \mu m \qquad (1),$$

and $$d/(2\lambda_0') \leq 1 \qquad (2),$$

where d represents the size of the superconducting filament, and $\lambda_0'$ represents penetration depth of Campbell's a.c. magnetic field.

6 Claims, 9 Drawing Sheets

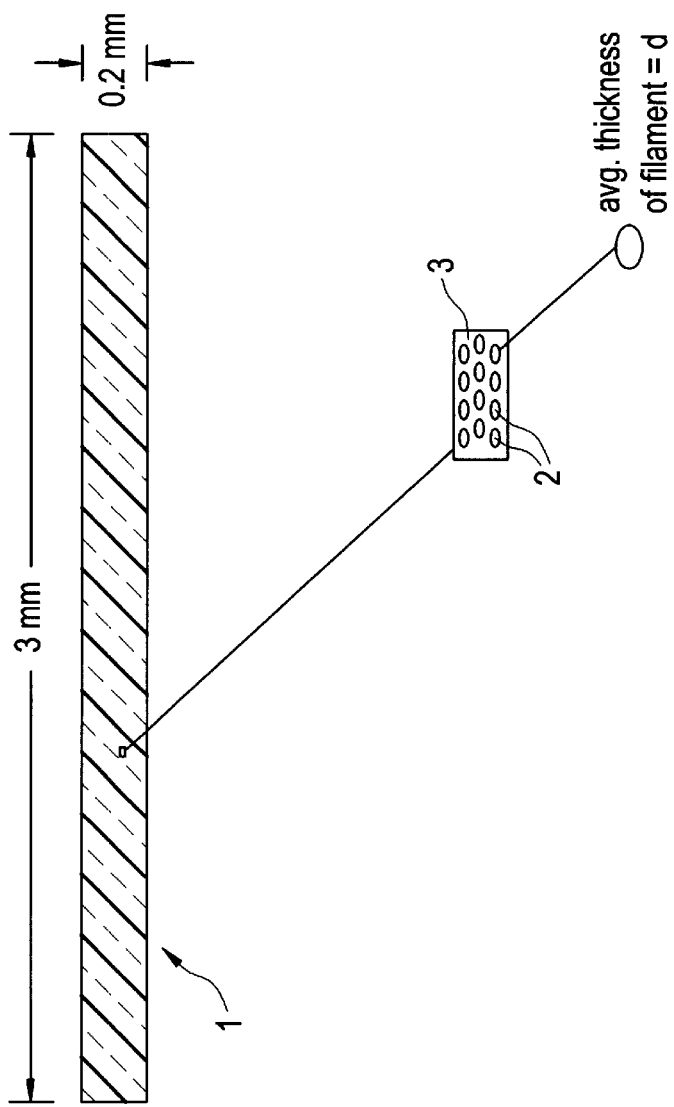

OXIDE SUPERCONDUCTING WIRE WITH REDUCED AC LOSS

TECHNICAL FIELD

The present invention relates to an oxide superconducting wire, and particularly to an oxide superconducting wire with reduced a.c. loss.

BACKGROUND ART

Generally, a superconducting multi-filamentary wire follows the critical state model, $W \propto H^3$ (H<Hp), and $W \propto H$ (H>Hp), where W represents loss and H represents applied magnetic field. Hp represents full penetration field, and Hp=·d/2, where d represents size of a filament and Jc represents critical current density. The same phenomenon also has been confirmed in oxide superconductors and metal superconductors. The loss is called hysteresis loss and is produced by irreversible movements of magnetic flux in the proximity of pinning potential. If the magnetic flux lines move only within the pinning potential, their movements become reversible. Hence, the loss mentioned above is not produced and the a.c. loss of the wire is expected to be significantly reduced.

This phenomenon has been confirmed in a metal superconducting wire having sub micron size filaments. It has been confirmed in the metal superconducting wire, that when the size of the filament is equal to or less than $\lambda_0'$ (penetration depth of Campbell's a.c. magnetic field), the a.c. loss characteristics cannot be explained according to the critical state model, and the amount of a.c. loss drops significantly below the amount of loss expected from the critical current model.

The same effect is expected to hold also in an oxide superconducting multi-filamentary wire, although it has not been confirmed in experiments due to the theoretical imperfection of the pinning phenomenon in oxide superconductors.

For a metal-coated oxide superconducting wire, the number of filaments has been increased mainly to improve its mechanical strength. The shape and the size of the filament, however, have not been optimized in view of the a.c. loss reduction, because basic studies of the a.c. characteristics of the oxide superconducting wire is yet at a fledging stage and little has been known about it.

In addition, though it has recently come to be generally accepted that the behavior of oxide superconductor at a.c. follows the critical state model qualitatively, various research groups are still investigating the a.c. loss characteristics in the oxide superconducting wire and more detailed quantitative interpretation thereof has not been acquired.

DISCLOSURE OF THE INVENTION

An object of the present invention is to provide a low-loss oxide superconducting wire utilizing a reversible phenomenon.

An oxide superconducting wire according to the present invention, formed of a metal coated multi-filamentary superconductor containing a plurality of superconducting filaments fit in a matrix, is characterized in that when the wire is electrified with an a.c. current in liquid nitrogen (77 K), $$d \leq 2 \quad (1),$$

where d represents size of the superconducting filament in $\mu$m.

An oxide superconducting wire according to the present invention, formed of a metal coated multi-filamentary superconductor containing a plurality of superconducting filaments fit in a matrix, is characterized in that when the wire is electrified with an a.c. current in liquid nitrogen (77 K), $$d \leq 2 \quad (1),$$

and $$d/(2\lambda_0') \leq 1 \quad (2),$$

where d represents size of the superconducting filament in $\mu$m, and $\lambda_0'$ represents penetration depth of Campbell's a.c. magnetic field.

An oxide superconducting wire according to the present invention, formed of a metal coated multi-filamentary superconductor containing a plurality of superconducting filaments fit in a matrix, is characterized in that when the wire is electrified with an a.c. current at a temperature t (K) lower than the critical temperature of the multi-filamentary superconductor, $$d \leq \{76/(107-t)\} - 0.4 \quad (3),$$

where d represents size of the superconducting filament.

In the present invention, when the superconducting filament is of tape-like shape, the superconducting filament size d represents an average thickness of the tape-like filament.

In the present invention, Bi-2223 phase, for example, is used for the oxide superconductor.

Further, in the present invention, a silver alloy, for example, is used as a metal coating material.

Still further, in the present invention, the superconducting filament may be divided into plural portions to be multi-filamentary.

In the present invention, the matrix is preferably of an alloy with a higher resistance than silver. When such an alloy is used for the matrix, the loss can be reduced.

Still further, in the present invention, the multi-filamentary superconducting filament is twisted, because twisting can further reduce the loss.

BRIEF DESCRIPTION OF THE DRAWINGS

FIG. 9 shows a cross-sectional view of a wire according to the invention, with an exploded view to show the superconducting filaments.

BEST MODE FOR CARRYING OUT THE INVENTION

When a superconducting wire is used in an a.c. magnetic field, irreversible movement of magnetic flux lines produces hysteresis loss. It is generally known that when amplitude Hm of the a.c. magnetic field is small, the loss can be closely approximated by the following expression, $$W = 4\mu_0 \cdot Hm^3/(3Jc \cdot d) \quad (4),$$

where Jc is critical current density in A/m² and d is diameter of a superconducting filament in μm.

The loss (hysteresis loss) is caused by the unstable phenomenon (irreversible phenomenon) generated when the magnetic flux falls in or jumps out of the pinning potential in the superconductor. If the movement of magnetic flux lines is limited only within the pinning potential (reversible phenomenon), the loss cannot be expressed in the above theoretical expression of the hysteresis loss. In other words, when the amplitude of the applied magnetic field decreases, the above described theoretical expression of the hysteresis loss does not hold to an actual amount of loss and the loss is expected to be reduced greatly.

The penetration depth ($\lambda_0'$) of Campbell's a.c. magnetic field is proposed as a basis for determining whether reversible movement occurs. The relationship between the reversible movement and the value of $\lambda_0'$ has been confirmed in a metal ultra-fine multi-filamentary superconducting wire. In a Nb—Ti wire, for example, an a.c loss is decreased by the reversible phenomenon under the condition of 1 T and d<<0.5 μm in liquid helium.

An experiment was carried out for confirmation in which a magnetization curve of a superconducting wire is found, loss of a superconductor is found from a loop area of the magnetization curve, and a theoretical value of the hysteresis loss is compared with a value obtained through the experiment.

Figure 1:
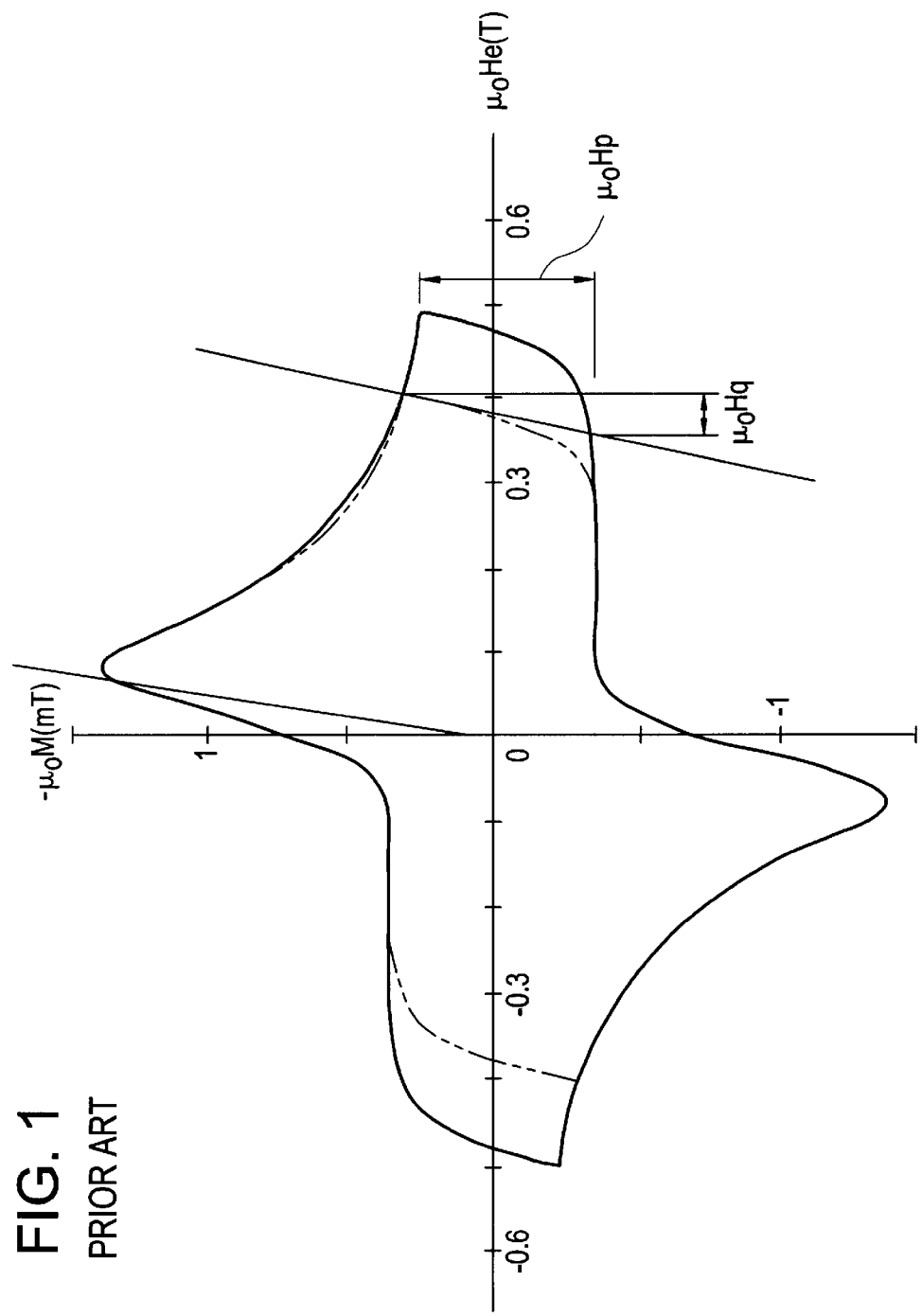
FIG. 1 shows a magnetization curve of a metal superconducting wire.

FIG. 1 shows the magnetization curve of the superconducting wire as described above.

According to the experiment, it has been found that an a.c. loss of a Nb—Ti wire is significantly decreased below a theoretical value of the hysteresis loss in a Nb—Ti wire sample with a filament size not more than 0.5 μm.

In addition, according to the following procedure, $\lambda_0'$ can be found. First, a minor magnetization curve as shown in FIG. 1 is determined. Then a tangential line is extended until it reaches a major curve on the opposite side, and width Hq of amplitude between two curves is sought. According to Campbell's model, a slope Hp/Hq of the minor curve is found as a function of $d/(2\lambda_0')$ alone and given by the expression, $$Hp/Hq = 1 - (2\lambda_0'/d)\tanh\{d/(2\lambda_0')\} \quad (5).$$

When $\lambda_0'$ of the Nb—Ti wire at 1 T is determined based on the above expression, $\lambda_0'=0.5$ μm. Thus it is proved that the filament size of a wire, whose loss obtained from the experiment does not coincide with the value obtained from the theoretical expression of the hysteresis loss, coincides well with $\lambda_0'$ obtained through the measurement. Hence, the validity of the above mentioned Campbell's theory of the reversible phenomenon is confirmed.

As for the oxide superconductor, though the same reversible phenomenon is expected to exist, its effect has not been revealed. According to the present invention it was confirmed for the first time that the a.c. loss was reduced by the reversible phenomenon of magnetic flux in the oxide superconducting wire, and a low-loss oxide superconducting wire utilizing the reversible phenomenon is provided.

First, as for a Bi-2223 silver-coated multi-filamentary wire, 3 mm in width, 0.22 mm in thickness, 24% in superconductor occupancy rate (the ratio of superconducting material contained in the wire), 10 μm in average thickness of a superconducting filament and with 61 filaments, the inventors first determined a magnetization curve similar to one in FIG. 1 under a given temperature condition, and then determined the loss in the superconductor from a loop area of the magnetization curve. Here, the applied magnetic field was in a magnetic field range where Jc≠0.

Figure 2:
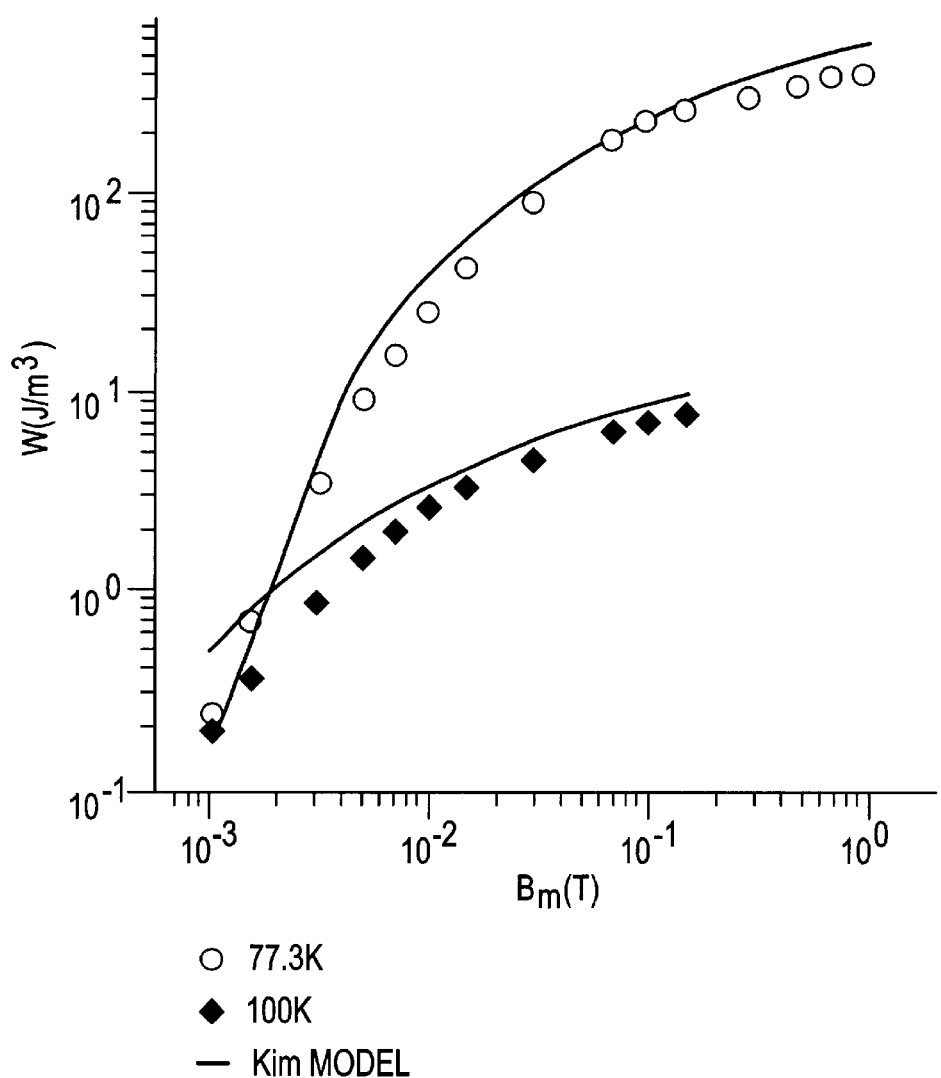
FIG. 2 shows the relationship between applied magnetic field and a.c. loss in a Bi superconductor.

FIG. 2 shows the a.c. loss of the superconductor found as described above. In FIG. 2, the abscissa represents applied magnetic field Bm (T) and the ordinate represents a.c. loss W (J/m³). In addition, a theoretical value of the hysteresis loss of the superconducting wire determined from Kim model, is shown by a solid line in the figure.

With reference to FIG. 2, at 77.3 K, the theoretical value of the hysteresis loss coincides well with a experimental result over all measured magnetic field range (0.001 T–0.1 T), whereas at 100 K, the experimental result deviates noticeably from the theoretical value. This result suggests the effect of reversibility at 100 K.

Next, based on the result obtained from the magnetization curve and above expression (5), $\lambda_0'$ of the Bi superconducting wire was determined at various values of applied magnetic field.

Figure 3:
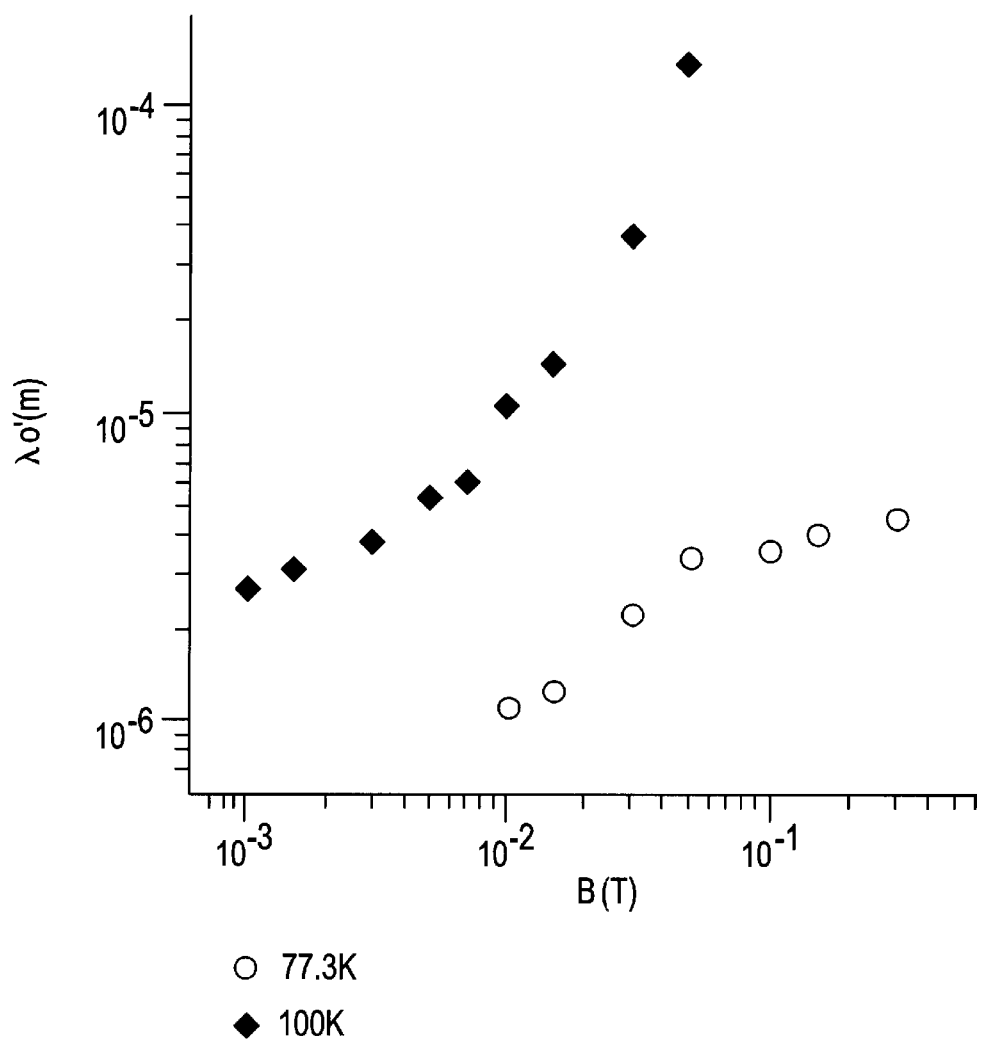
FIG. 3 shows the relationship between applied magnetic field and penetration depth of Campbell's a.c. magnetic field in a Bi superconductor.

FIG. 3 shows $\lambda_0'$ of the Bi superconducting wire thus determined. In FIG. 3, the abscissa represents applied magnetic field B (T), and the ordinate represents penetration depth $\lambda_0'$ of Campbell's a.c. magnetic field.

Theoretically, the reversible phenomenon becomes noticeable when the superconductor sample size d becomes approximately equal to or smaller than $\lambda_0'$, that is, when the following expression (6) is satisfied:

$$\lambda_0' \geq d/2 \quad (6).$$

Figure 4:
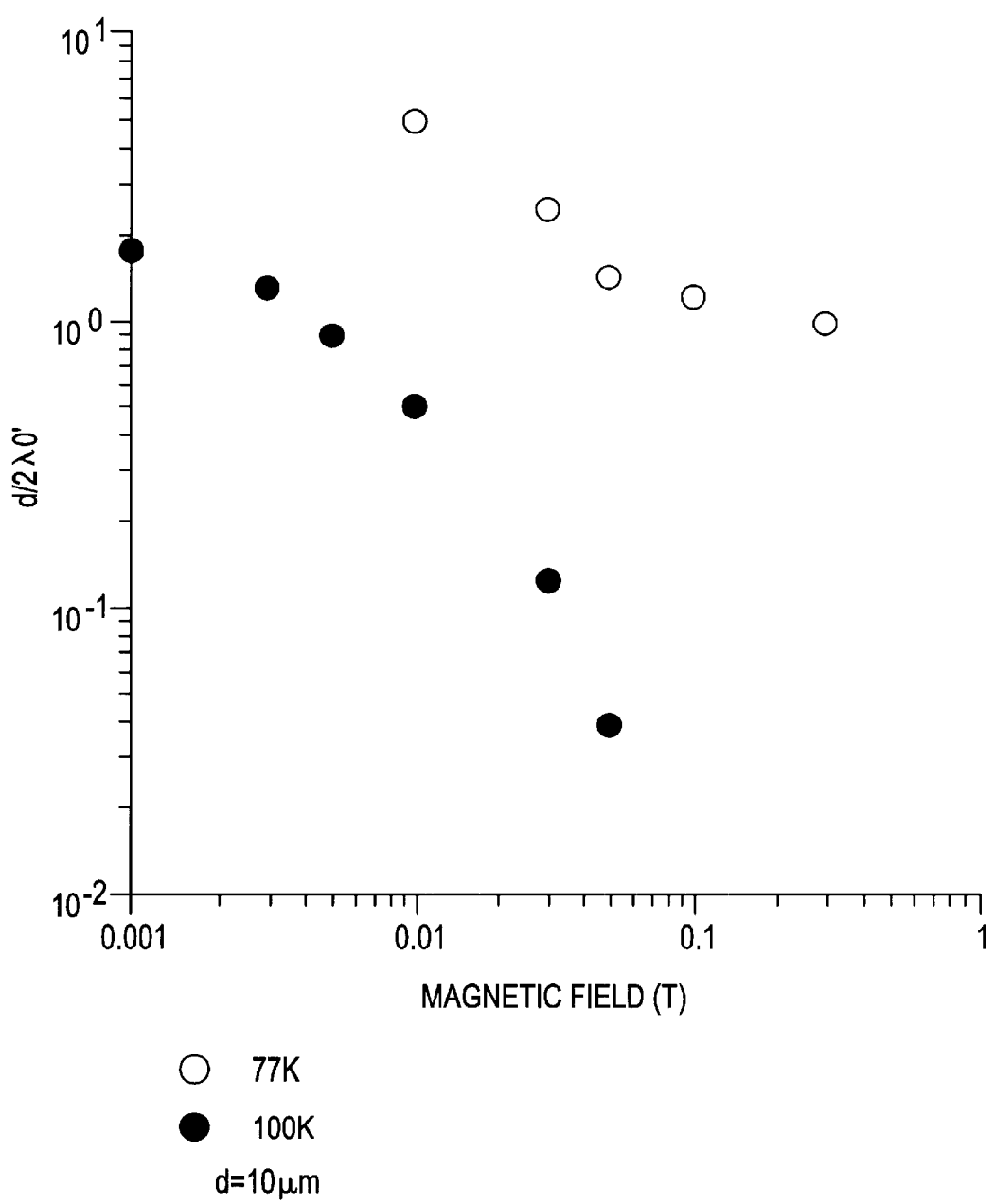
FIG. 4 shows the relationship between applied magnetic field and value of $d/(2\lambda_0')$ in a Bi superconductor.

In FIG. 4, $d/(2\lambda_0')$ is plotted along the y-axis based on the result shown in FIG. 3. In this figure, d=10 μm.

With reference to FIG. 4, the expression (6) shown above approximately holds over all the range where magnetic field is equal to or more than 0.001 T. It is understood from this result that the deviation of the theoretical loss value from the measured loss value at 100 K as shown in FIG. 2 is caused by the reversible phenomenon as explained in Campbell's theory. On the other hand, at the temperature of 77 K, $d/(2\lambda_0') \geq 1$ over all the measured magnetic field range. Thus, it has been found that with this sample (where d=10 μm), the reduction in a.c. loss is not expected to be caused by the reversible phenomenon.

In addition, in FIG. 3, at 100 K and 0.001 T, $d/(2\lambda_0')=2$ approximately. In this case, though $d/(2\lambda_0')$ is slightly larger than 1, the a.c. loss reduction effect caused by the reversible phenomenon is noticeable as shown in FIG. 2. Conversely, at 100 K and 0.05 T, $d/(2\lambda_0')=0.04$ approximately. In this case, though the value of $d/(2\lambda_0')$ is sufficiently smaller than 1, the difference between the experimental result and the theoretical value of the hysteresis loss is small as shown in FIG. 2.

The reversible phenomenon that Campbell suggested is noticeable in a magnetic field range with low magnetism, where the magnetic flux movement is limited within the pinning potential as described above, and its effect is hard to recognize in the magnetic field range with high magnetism even if above expression (6) is satisfied. This explains why the effect of reversibility is insignificant at 100 K and 0.05 T.

According to the analysis described above, it has been found that $d/(2\lambda_0')$ must be at least at the same level as at 100 K over the entire magnetic field range in order to obtain the same effect as at 100 K under other temperature condition.

In addition, it has been found that, at the temperature of 100 K, in the superconducting wire with filament size of 10 μm, the effect of a.c. loss reduction by the reversible phenomenon can be expected.

In practice, however, a wire is most frequently used at the temperature of liquid nitrogen (77 K) which is generally used as refrigerant. It is, therefore, the reduction of a.c. loss at this temperature condition that is important.

Thus, the inventors tried to determine a filament size with which the effect of the reversible phenomenon was expected at the temperature of 77 K, based on the thus obtained data.

As $\lambda_0'$ is a physical quantity basically independent of the filament size, at various superconducting filament size of the superconducting wire, values of $d/(2\lambda_0')$ were determined based on the value of $\lambda_0'$ at 77 K found from FIG. 3.

Figure 5:
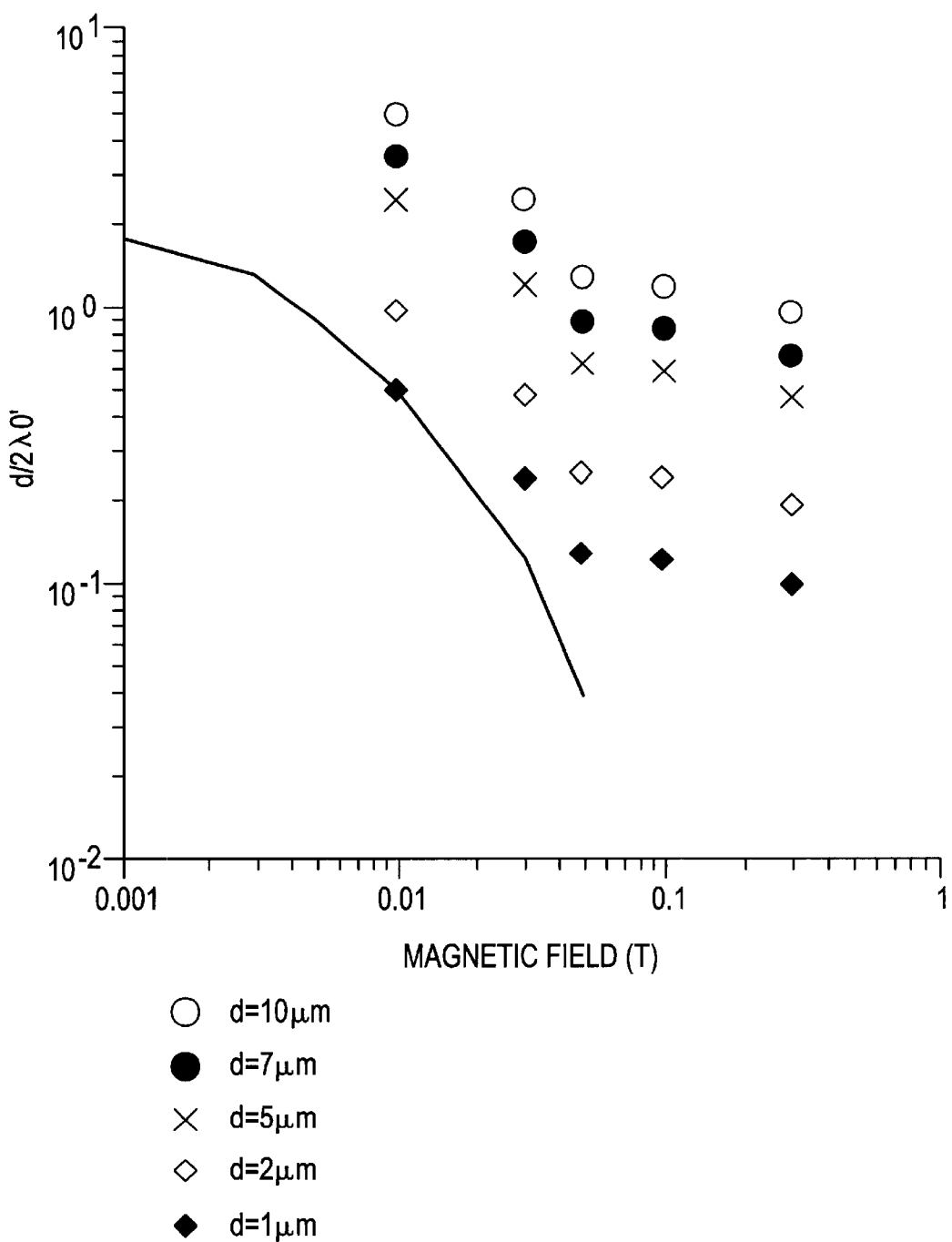
FIG. 5 shows the relationship between applied magnetic field and value of $d/(2\lambda_0')$ in Bi superconductors with various filament sizes.

FIG. 5 shows the values of $d/(2\lambda_0')$ thus obtained. The solid line in the figure represents data at 100 K where the effect of loss reduction due to the reversible phenomenon was observed.

With reference to FIG. 5, it has been found that the superconducting filament size must be equal to or less than 2 μm to make expression (6) hold at 77 K over the entire measured magnetic field range. Further, it has been found that the filament size must be equal to or less than 1 μm to achieve the similar effect as at 100 K.

Next, as for a Bi-2223 silver-coated multi-filamentary wire, 3 mm in width, 0.22 mm in thickness, 15% in superconductor occupancy rate, 2 μm in average thickness of a superconducting filament and with 1369 filaments, a magnetization curve similar to FIG. 1 was determined under the temperature condition of 77 K, and then loss of the superconductor was determined from a loop area of the magnetization curve. Here, the applied magnetic field was in a magnetic field range where Jc≠0.

Figure 6:
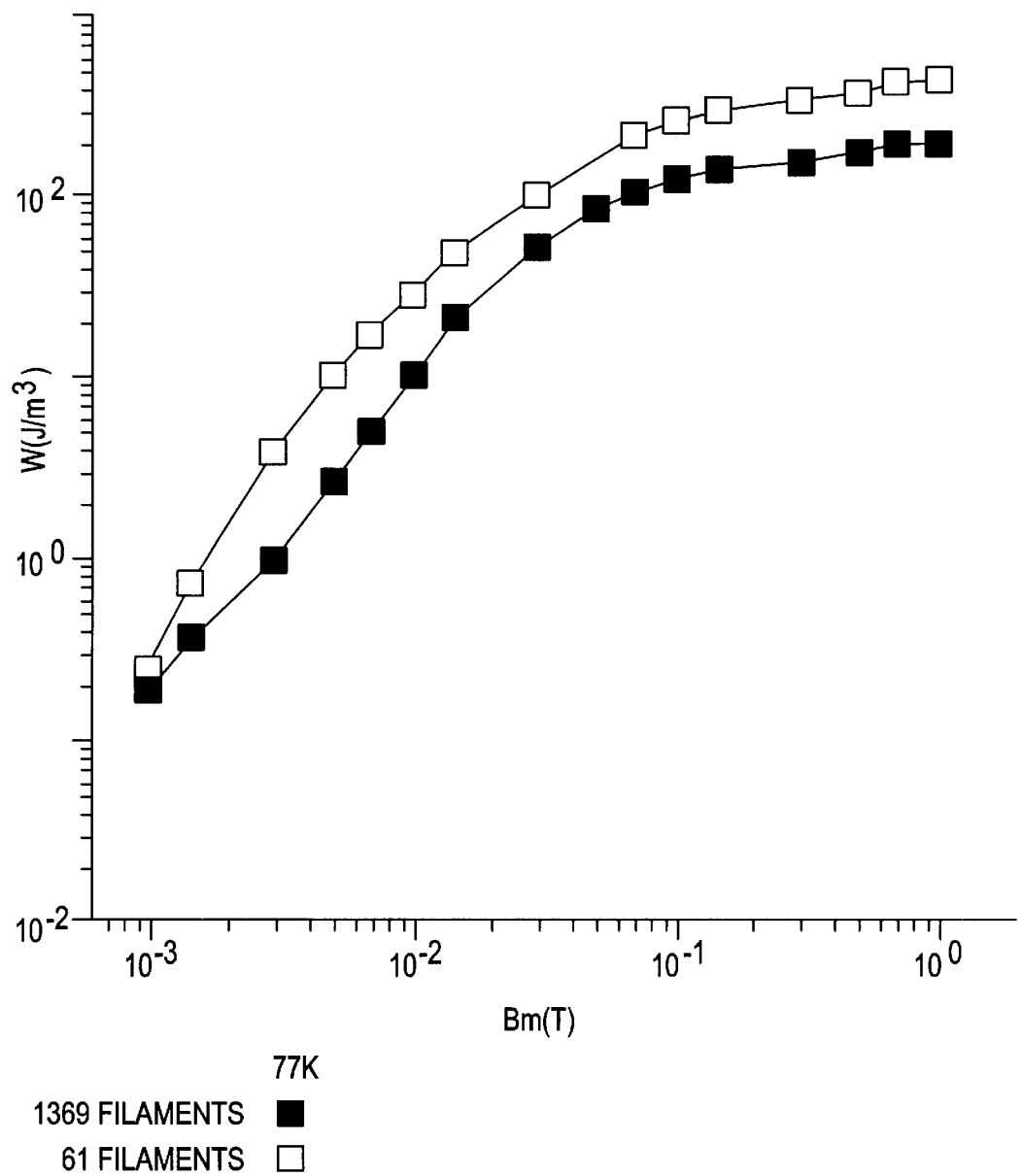
FIG. 6 shows a.c. loss in a sample with 10 $\mu$m size filaments as compared with a.c. loss in a sample with 2 $\mu$m size filaments at 77 K.

FIG. 6 is a graph showing the a.c. losses at 77 K of a sample with 10 μm size filaments and a sample with 2 μm size filaments. In FIG. 6, the abscissa represents applied magnetic field Bm (T) and the ordinate represents a.c. loss W (J/mm$^3$).

In a superconducting wire following the critical current state model, in the magnetic field range with higher magnetism than the full penetration field, the a.c. loss decreases as the filament size becomes smaller, whereas, in the magnetic field range with magnetism not higher than the full penetration field, the a.c. loss increases as the filament size becomes smaller as shown in expression (4).

As shown in FIG. 6, however, the wire with 2 μm size filaments has smaller a.c. loss over the entire magnetic field range, contrary to the assumption based on the critical current state model. This is because the reversible movement of magnetic flux becomes noticeable due to decreased filament thickness. Thus the assumption that the superconducting filament size must be equal to or less than 2 μm to make expression (6) hold at temperature of 77 K was confirmed by the experiment.

In addition, as for the Bi-2223 silver-coated multi-filamentary wire with 1369 filaments, a slope Hp/Hq of the minor magnetization curve at the transition from magnetization to demagnetization at the magnetization measurement were determined under the temperature conditions of 100 K, 90 K, 77 K, 65 K and 50 K, and $\lambda_0'$ at each temperature was determined according to the expression (5).

Figure 7:
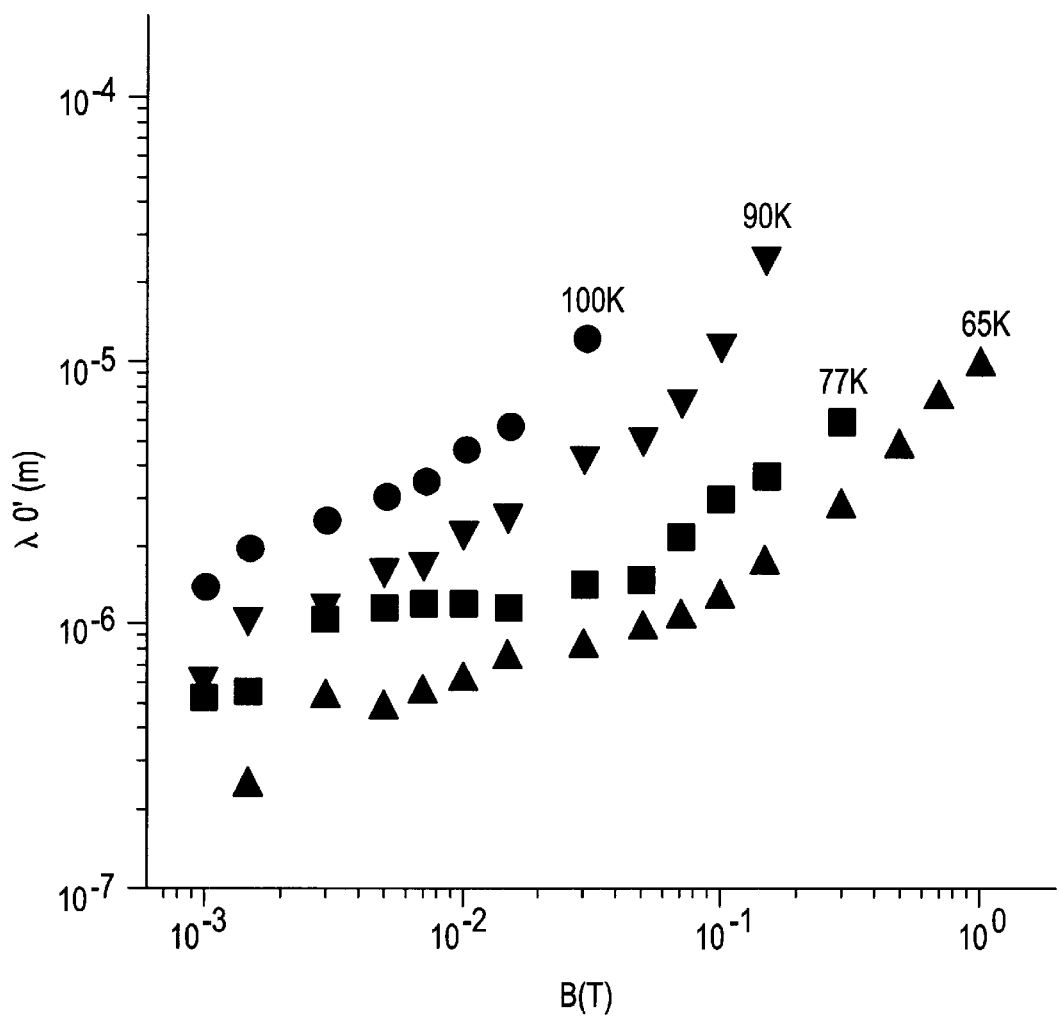
FIG. 7 shows the relationship between applied magnetic field Bm (T) and $\lambda_0'$ ($\mu$m) at various temperatures.

FIG. 7 shows the relationship of applied magnetic field Bm (T) and $\lambda_0'$ (μm) at various temperatures. Here, the applied magnetic field was in a magnetic field range where Jc≠0.

With reference to FIG. 7, $\lambda_0'$ tends to monotonously increase against the applied magnetic field.

Generally, when the superconducting wire is used as a part of a.c. device, a magnetic field applied to the wire is at least 0.01 T. Additionally, as described above, effect of reversibility appears in a range where expression (2) holds between filament size d and $\lambda_0'$.

As shown in FIG. 7, $\lambda_0'$ increases versus the magnetic field. Therefore, filament size d (μm) at a temperature t (K) must satisfy the following expression (7) in order to utilize the effect of reversibility in a range where magnetic field is equal to or above 0.01 T.

$$d \leq 2\lambda_0'(t, 0.01 \text{ T}) \tag{7}$$

Here, "$\lambda_0'$ (t, 0.01 T)" represents the penetration depth of Campbell's a.c. magnetic field at temperature t and applied magnetic field 0.01 T.

Additionally, as $\lambda_0'$ is a physical quantity independent of the filament size, the relationship between the temperature of the superconducting wire containing Bi-2223 as main phase and $\lambda_0'$ can be deduced.

Figure 8:
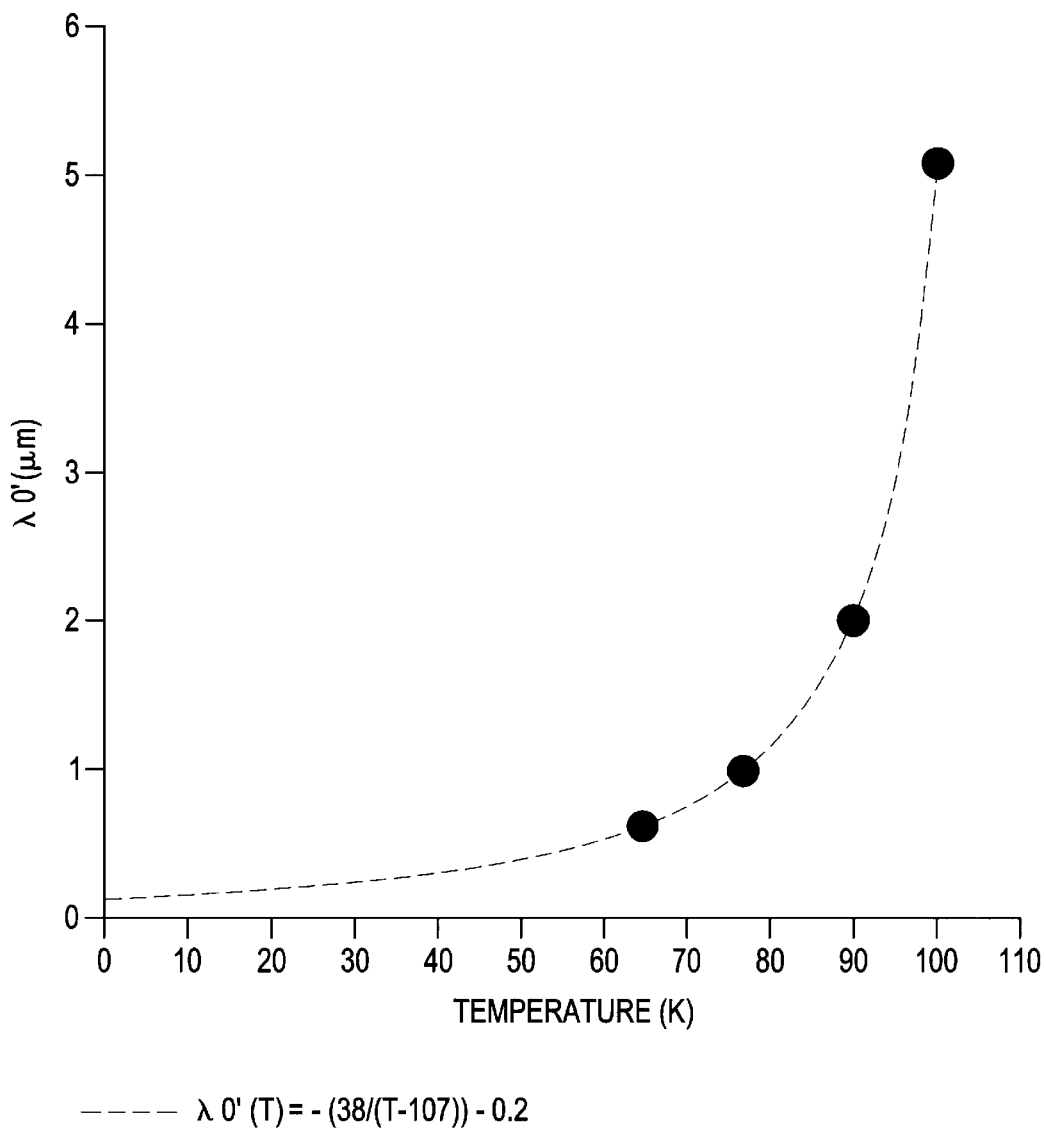
FIG. 8 shows a relationship between temperature (K) and $\lambda_0'$ ($\mu$m).

FIG. 8 shows a relation between temperature (K) and $\lambda_0'$ (μm). Here, applied magnetic field is 0.01 T.

From FIG. 8, the following expression (8) can be obtained as an approximate expression of $\lambda_0'$ (t, 0.01 T).

$$\lambda_0'(t, 0.01 \text{ T}) \leq \{38/(107-t)\} - 0.2 \tag{8}$$

Here, substituting the expression (8) into expression (7), the filament size d (μm) necessary for utilizing the effect of reversibility at a given temperature when a.c. current flows through the wire can be estimated, and the following expression (3) is obtained.

$$d \leq \{76/(107-t)\} - 0.4 \tag{3}$$

Thus, in the procedure described above, the expression for deriving the filament size necessary for utilizing the effect of reversibility at an optional temperature could be obtained.

First Embodiment

Two multi-filamentary oxide superconducting wires with silver sheaths were manufactured, respectively with an average thickness d of superconducting filaments of 2 μm and 1 μm.

First, a wire 1 with 2 μm size filaments was manufactured. A silver pipe was filled with superconducting material powder and drawn. Thirty-seven drawn pipes were put together and again fit into a silver pipe and drawn. Nineteen such pipes were again fit into a silver pipe and drawn until its diameter became ≈1 mm. Thereafter rolling and sintering processes were performed repeatedly and thus the wire 1 containing superconducting filaments 2 surrounded by matrix 3 as shown in FIG. 9 was manufactured.

The finished wire 1 was 3 mm wide and 0.2 mm thick, and included 703 filaments 2 with average thickness d of 2 μm.

Another wire 1 with 1 μm size filaments was manufactured according to the following procedure. First, a silver pipe was filled with superconducting material powder and drawn. Then, sixty-one such pipes were put together and fit into a silver pipe again and drawn. Then again sixty-one such pipes were put together and fit into a silver pipe and drawn until its diameter became ≈1 mm. Thereafter rolling and sintering processes were performed repeatedly and thus the wire wire 1 containing superconducting filaments 2 surrounded by matrix 3 as shown in FIG. 9 was manufactured.

The finished wire 1 was 3 mm wide and 0.2 mm thick, and included 3721 filaments 2 with average thickness d of 1 μm.

Magnetization measurement was performed at 77 K by SQUID in these two oxide superconducting wires, and the a.c. loss was determined and compared with the value obtained from the theoretical expression. As a result, the reduction in a.c. loss, which is considered to be produced by the effect of reversibility, was observed as expected. In addition, it was found through the comparison of the losses in the two wires that the loss is smaller in the wire with 1 μm size filaments than in the wire with 2 μm filaments.

Second Embodiment

Using a silver alloy pipe containing 10 at. % of gold, a wire with 1 μm size filaments and a wire with 2 μm size filaments were manufactured according to the same procedures as the first embodiment. Other conditions were the same as in the first embodiment and the description thereof will not be repeated.

Together with the wires previously manufactured, a.c. losses of the wires were measured according to the a.c. magnetization method where an a.c. magnetic field is applied at 77 K. As a result, in every sample, though an eddy-current loss and a coupling loss were produced besides a hysteresis loss, and the a.c. loss was increased compared with the previous result, it was confirmed that the loss increase can be suppressed to about one tenth in the alloy wire compared with the wire with silver pipes as a matrix.

Third Embodiment

Using a silver alloy pipe containing 10 at. % of gold, a wire was drawn to the diameter of ≈1 mm in the same manner as in the first embodiment. Then, the wire was twisted, rolled, sintered and thus a Bi silver alloy-coated twisted superconducting wire with the same size as the wire of the first embodiment and with the pitch of 5 mm was manufactured. Here, other conditions were the same as in the first embodiment and the description thereof will not be repeated.

Together with the wire manufactured in the first embodiment, the a.c. losses of the wires were measured by the a.c. magnetization method in which an a.c. magnetic field is applied at 77 K. As a result, in every sample, though an eddy current loss and a coupling loss were produced besides a hysteresis loss, and the a.c. loss was increased compared with the previous result, it was confirmed that in the twisted alloy wire, the loss increase could be suppressed to about one tenth that in the wire with a silver pipe as a matrix.

Fourth Embodiment

Using the expression (3) for deriving the filament size necessary for utilizing the effect of reversibility, a necessary filament size d (μm) at the temperature of 90 K which corresponds to the boiling point of liquid oxygen was estimated.

As a result, d (μm)≦4 was obtained, and setting the average filament size of 4 μm as a goal, a multi-filamentary superconducting wire with a silver sheath was manufactured.

First, a silver pipe was filled with superconducting material powder and drawn. The seven drawn pipes were put together and fit in a silver pipe again and drawn. Then 37 such pipes are further put together and fit in a silver pipe and drawn until the diameter became ≈1 mm, then, rolled and sintered. Finally, a final rolling process was performed so that the filament size became 4 μm and then a final sintering was performed. The superconducting wire finally obtained was 3.0 mm in width, 0.20 mm in thickness, and included 259 filaments.

The magnetization measurement of thus obtained wire was performed at 90 K and 85 K by SQUID and the a.c. loss was obtained and compared with the theoretical value. As a result, measured a.c. loss at 90 K was confirmed to be smaller than the value estimated from the critical current state model as previously expected. On the other hand, data at 85 K was confirmed to coincide with the value estimated from the critical current state model within the range of measured magnetic field.

The results thus obtained reveal the validity of selecting the optimal filament size based on the expression (3) according to the temperature at which the wire is used.

As can be seen from the foregoing, according to the present invention, the reduction of a.c. loss due to the reversible phenomenon of magnetic flux in an oxide superconducting wire is confirmed and a low-loss oxide superconducting wire using the reversible phenomenon is obtained.

What is claimed is:

1. An oxide superconducting wire formed of a metal-coated multi-filamentary superconductor having a plurality of superconducting filaments in a matrix, wherein $$d \leq 2 \tag{1}$$

and $$d/(2\lambda_0') \leq 1 \tag{2}$$

where d represents thickness of said superconducting filament in μm, $\lambda_0'$ represents penetration depth of Campbell's a.c. magnetic field under an a.c. magnetic field of 0.01 at 77 K.

2. The oxide superconducting wire according to claim 1, wherein said matrix is of an alloy with higher resistance than silver.

3. The oxide superconducting wire according to claim 1, wherein said superconducting filaments are twisted.

4. The oxide superconducting wire according to claim 1, wherein said multi-filamentary superconductor is a superconductor with Bismuth-2223 phase as a main phase.

5. The oxide superconducting wire according to claim 1, wherein said oxide superconducting wire is cooled in liquid nitrogen and electrified with an a.c. current.

6. An oxide superconducting wire formed of a metal-coated multifilamentary superconductor having plurality of superconducting filaments in a matrix, wherein $$d \leq 2 \tag{1}$$

and $$d/(2\lambda_0') \leq 1 \tag{2}$$

where d represents average thickness of said superconducting filament in μm, $\lambda_0'$ represents penetration depth of Campbell's a.c. magnetic field under an a.c. magnetic field of 0.01 at 77 K or wherein $$d \leq \{76/(107-t)\} - 0.4$$

where t represents temperature in K when said oxide superconducting wire is electrified with an a.c. current and is at most the critical temperature of said multifilamentary superconductor, d represents filament average thickness of said oxide superconducting wire in μm under an a.c. magnetic field of 0.01 at 77 K.

* * * * *